(12) United States Patent
Jeon et al.

(10) Patent No.: US 10,855,090 B2
(45) Date of Patent: Dec. 1, 2020

(54) BATTERY MANAGEMENT APPARATUS, BATTERY MODULE, AND BATTERY PACK

(71) Applicant: Samsung Electronics Co., Ltd., Suwon-si (KR)

(72) Inventors: Jin Yong Jeon, Yongin-si (KR); Young Jae Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 128 days.

(21) Appl. No.: 16/215,992

(22) Filed: Dec. 11, 2018

(65) Prior Publication Data

US 2020/0067323 A1 Feb. 27, 2020

(30) Foreign Application Priority Data

Aug. 23, 2018 (KR) .................. 10-2018-0098516

(51) Int. Cl.
| | |
|---|---|
| *H02J 7/00* | (2006.01) |
| *G01R 31/392* | (2019.01) |
| *B60L 58/22* | (2019.01) |
| *G01R 31/36* | (2020.01) |
| *G08C 17/00* | (2006.01) |

(Continued)

(52) U.S. Cl.
CPC ............ *H02J 7/0014* (2013.01); *B60L 58/22* (2019.02); *G01R 31/3644* (2013.01); *G01R 31/392* (2019.01); *G08C 17/00* (2013.01); *H01M 10/441* (2013.01); *G08C 2201/00* (2013.01);

(Continued)

(58) Field of Classification Search
CPC ...... H02J 7/0021; H02J 7/0014; H02J 7/0047; H02J 7/00034; H02J 7/00036; H01M 10/441; H01M 2220/20; H01M 2010/4271; H01M 10/425; H01M 2/1016; H01M 10/482; H01M 10/4207; H01M 2010/4278; G01R 31/392; G01R 31/3644; G08C 17/00; G08C 2201/00; Y02E 60/10; Y02T 10/70; Y02T 90/16; B60L 58/18; B60L 58/22
See application file for complete search history.

(56) References Cited

U.S. PATENT DOCUMENTS

| | | |
|---|---|---|
| 8,054,038 B2 | 11/2011 | Kelty et al. |
| 8,117,857 B2 | 2/2012 | Kelty et al. |

(Continued)

FOREIGN PATENT DOCUMENTS

| | | |
|---|---|---|
| EP | 2 922 171 A1 | 9/2015 |
| JP | 2008-118575 A | 5/2008 |

(Continued)

OTHER PUBLICATIONS

Extended European Search Report dated Apr. 8, 2019 in counterpart European Application No. 19156842.7 (9 pages in English).

*Primary Examiner* — Nha T Nguyen
(74) *Attorney, Agent, or Firm* — NSIP Law

(57) ABSTRACT

A battery management apparatus includes a processor configured to collect sensing data of a battery using a sensor, and infrared (IR) communicators located to face a neighboring battery management apparatus of the battery management apparatus. The processor is configured to transmit the collected sensing data to the neighboring battery management apparatus using one of the IR communicators.

23 Claims, 17 Drawing Sheets

(51) Int. Cl.
*H01M 10/44* (2006.01)
*H01M 10/42* (2006.01)

(52) U.S. Cl.
CPC ............... *H01M 2010/4271* (2013.01); *H01M 2010/4278* (2013.01); *H01M 2220/20* (2013.01)

(56) References Cited

U.S. PATENT DOCUMENTS

| | | |
|---|---|---|
| 8,508,191 B2 | 8/2013 | Kim et al. |
| 8,618,775 B2 | 12/2013 | Hermann et al. |
| 8,624,560 B2 | 1/2014 | Ungar et al. |
| 8,961,203 B2 | 2/2015 | Lee |
| 8,972,213 B2 | 3/2015 | Zhang et al. |
| 2013/0253715 A1 | 9/2013 | Cho et al. |
| 2018/0012484 A1 | 1/2018 | Sakabe et al. |
| 2018/0351144 A1* | 12/2018 | Huff ...................... H01M 2/305 |
| 2019/0356143 A1* | 11/2019 | Lee ...................... G01R 31/396 |

FOREIGN PATENT DOCUMENTS

| | | |
|---|---|---|
| JP | 4863156 B2 | 1/2012 |
| KR | 10-2009-0053605 A | 5/2009 |
| KR | 10-2012-0133620 A | 12/2012 |
| KR | 10-2013-0101457 A | 9/2013 |
| KR | 10-2016-0069397 A | 6/2016 |
| KR | 10-2016-0111382 A | 9/2016 |
| KR | 10-2017-0107214 A | 9/2017 |
| KR | 10-2018-0021501 A | 3/2018 |
| WO | WO 2015/063945 A1 | 5/2015 |

\* cited by examiner

BATTERY MANAGEMENT APPARATUS, BATTERY MODULE, AND BATTERY PACK

CROSS-REFERENCE TO RELATED APPLICATION(S)

This application claims the benefit under 35 USC § 119(a) of Korean Patent Application No. 10-2018-0098516, filed on Aug. 23, 2018, in the Korean Intellectual Property Office, the entire disclosure of which is incorporated herein by reference for all purposes.

BACKGROUND

1. Field

The following description relates to a battery management apparatus, a battery module, and a battery pack.

2. Description of Related Art

A battery module includes one or more battery cells, and a plurality of battery modules form a battery pack. A battery management system (BMS) may be installed in each battery module, which may correspond to a battery module-based BMS. Also, a BMS may be installed in each battery cell, which may correspond to a battery cell-based BMS.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a battery management apparatus including a processor configured to collect sensing data of a battery using a sensor, and infrared (IR) communicators located to face a neighboring battery management apparatus of the battery management apparatus, wherein the processor is configured to transmit the collected sensing data to the neighboring battery management apparatus using one of the IR communicators.

The battery management apparatus may include a hole corresponding to each of electrodes of the battery and a hole corresponding to a vent of the battery.

The processor may be located between the hole corresponding to the vent and a hole corresponding to one of the electrodes.

The IR communicators may be located adjacent to sides of a board of the battery management apparatus.

The IR communicators may include a first IR communicator set configured to perform an IR communication in a first lateral direction of the battery management apparatus, a second IR communicator set configured to perform an IR communication in a second lateral direction of the battery management apparatus, a third IR communicator set configured to perform an IR communication in a third lateral direction of the battery management apparatus, and a fourth IR communicator set configured to perform an IR communication in a fourth lateral direction of the battery management apparatus.

Each of the first IR communicator set through the fourth IR communicator set may include an IR communicator for transmission and an IR communicator for reception.

An IR communicator for transmission of each of the first IR communicator set through the fourth IR communicator set may be spaced apart from an IR communicator for reception of each of the first IR communicator set through the fourth IR communicator set.

In another general aspect, there is provided a battery module including batteries, and battery management apparatuses corresponding to the batteries, wherein each of the battery management apparatuses may include a processor configured to collect sensing data of a corresponding battery of the batteries, and infrared ray (IR) communicators located to face a neighboring battery management apparatus of the each of the battery management apparatuses.

A board of the each of the battery management apparatus may include a hole corresponding to each of electrodes of the corresponding battery and a hole corresponding to a vent of the corresponding battery.

The processor may be located between the hole corresponding to the vent and a hole corresponding to one of the electrodes.

The IR communicators may be located adjacent to sides of a board of each of the battery management apparatuses.

The IR communicators may include a first IR communicator set configured to perform an IR communication in a first lateral direction of each of the battery management apparatuses, a second IR communicator set configured to perform an IR communication in a second lateral direction of each of the battery management apparatuses, a third IR communicator set configured to perform an IR communication in a third lateral direction of each of the battery management apparatuses, and a fourth IR communicator set configured to perform an IR communication in a fourth lateral direction of each of the battery management apparatuses.

The first IR communicator set through the fourth IR communicator set may include an IR communicator for transmission and an IR communicator for reception.

An IR communicator for transmission of each of the first IR communicator set through the fourth IR communicator set may be spaced apart from an IR communicator for reception of each of the first IR communicator set through the fourth IR communicator set.

The battery module may include fixers that are configured to fix each of the battery management apparatuses to the corresponding battery.

Each of the fixers selectively blocks IR light output from the battery management apparatuses that may not be adjacent to the corresponding battery management apparatus.

In another general aspect, there is provided a battery pack including batteries, slave battery management apparatuses corresponding to the batteries, each of the slave battery management apparatuses including a processor configured to collect sensing data of a corresponding battery of the batteries, and infrared ray (IR) communicators located to face a neighboring slave battery management apparatus of the each of the slave battery management apparatuses, and a master battery management apparatus configured to control the slave battery management apparatuses.

A board of the each of the slave battery management apparatuses may include a hole corresponding to each of electrodes of the corresponding battery and a hole corresponding to a vent of the corresponding battery.

The processor may be located between the hole corresponding to the vent and a hole corresponding to one of the electrodes.

The IR communicators may be located adjacent to sides of a board of each of the slave battery management apparatuses.

The IR communicators may include a first IR communicator set configured to perform an IR communication in a first lateral direction of each of the slave battery management apparatuses, a second IR communicator set configured to perform an IR communication in a second lateral direction of each of the slave battery management apparatuses, a third IR communicator set configured to perform an IR communication in a third lateral direction of each of the slave battery management apparatuses, and a fourth IR communicator set configured to perform an IR communication in a fourth lateral direction of each of the slave battery management apparatuses.

Each of the first IR communicator set through the fourth IR communicator set may include an IR communicator for transmission and an IR communicator for reception.

The master battery management apparatus may be configured to perform a wire communication with a slave battery management apparatus configured to perform an IR communication with the master battery management apparatus, in response to the master battery management apparatus being misaligned with the slave battery management apparatus.

A slave battery management apparatus of the slave battery management apparatuses may be configured to perform a wire communication with a neighboring slave battery management apparatus, in response to the slave battery management apparatuses being misaligned with the neighboring slave battery management apparatus.

In another general aspect, there is provided a battery management apparatus including a processor configured to collect sensing data of a battery using a sensor, and infrared (IR) communicators located to face a neighboring battery management apparatus, wherein the processor is configured to transmit the collected sensing data to the neighboring battery management apparatus using one of the IR communicators, in response to the battery management apparatuses being aligned with the neighboring battery management apparatus, and transmit the collected sensing data to the neighboring battery management apparatus using wire communication, in response to the battery management apparatuses being misaligned with the neighboring battery management apparatus.

The battery management apparatus of claim 25, wherein each of the IR communicators may include an IR communicator for transmission and an IR communicator for reception, and the IR communicator for transmission and the IR communicator for reception are located adjacent to sides of a board of the battery management apparatus, spaced apart from each other, and substantially equidistant from a center of the board.

Other features and aspects will be apparent from the following detailed description, the drawings, and the claims.

Figure 1:
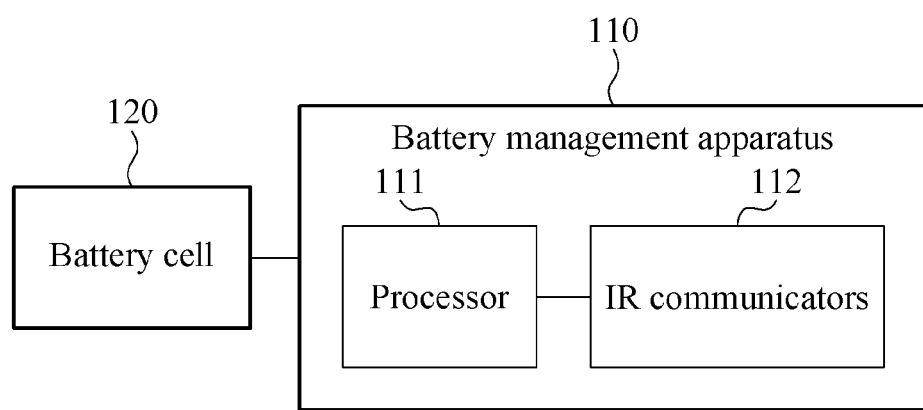
FIGS. 1 and 2 illustrate an example of a battery management apparatus.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Various modifications may be made to examples. However, it should be understood that these examples are not construed as limited to the illustrated forms and include all changes, equivalents or alternatives within the idea and the technical scope of this disclosure.

The terminology used herein is for the purpose of describing particular examples only and is not intended to be limiting of examples. As used herein, the singular forms are intended to include the plural forms as well, unless the context clearly indicates otherwise. For example, the articles "a," "an," and "the" are intended to include the plural forms as well, unless the context clearly indicates otherwise. It should be further understood that the terms "comprises" and/or "comprising," when used in this specification, specify the presence of stated features, integers, steps, operations, elements, components or a combination thereof, but do not preclude the presence or addition of one or more other features, integers, steps, operations, elements, components, and/or groups thereof.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Regarding the reference numerals assigned to the elements in the drawings, it should be noted that the same elements will be designated by the same reference numerals, wherever possible, even though they are shown in different drawings. Also, in describing of examples, detailed description of well-known related structures or functions will be omitted when it is deemed that such description will cause ambiguous interpretation of the present disclosure.

Figure 2:
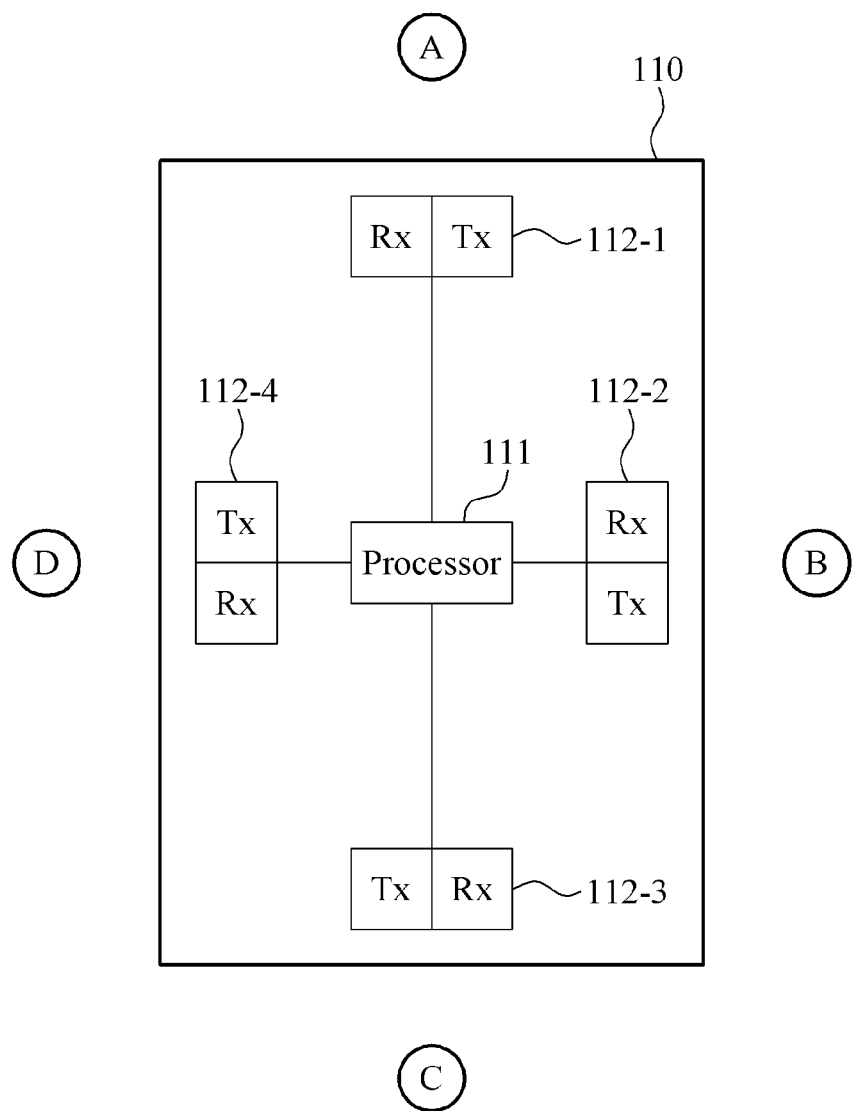

FIGS. 1 and 2 illustrate an example of a battery management apparatus 110.

Referring to FIG. 1, the battery management apparatus 110 includes a processor 111 and infrared (IR) communicators 112.

The processor 111 performs various functions of the battery management apparatus 110. For example, the processor 111 collects sensing data by sensing a battery cell 120, and transmits the collected sensing data to a neighboring battery management apparatus via one of the IR communicators 112. The sensing data includes one or more of data such as, for example, voltage data, current data and temperature data of the battery cell 120. Depending on examples, the processor 111 may estimate a state of charge (SOC) or a state of health (SOH) of the battery cell 120 based on sensing data of the battery cell 120.

The IR communicators 112 face at least one neighboring battery management apparatus of the battery management apparatus 110. For example, referring to FIG. 2, an IR communicator 112-1 faces a neighboring battery management apparatus at a location A, and an IR communicator 112-2 faces a neighboring battery management apparatus at a location B. Also, an IR communicator 112-3 faces a neighboring battery management apparatus at a location C, and an IR communicator 112-4 faces a neighboring battery management apparatus at a location D.

Through the IR communicators 112-1 through 112-4, the battery management apparatus 110 performs IR communications in various directions.

FIGS. 3A through 3D illustrate examples of a rear side of a battery management apparatus 110.

Figure 3A:
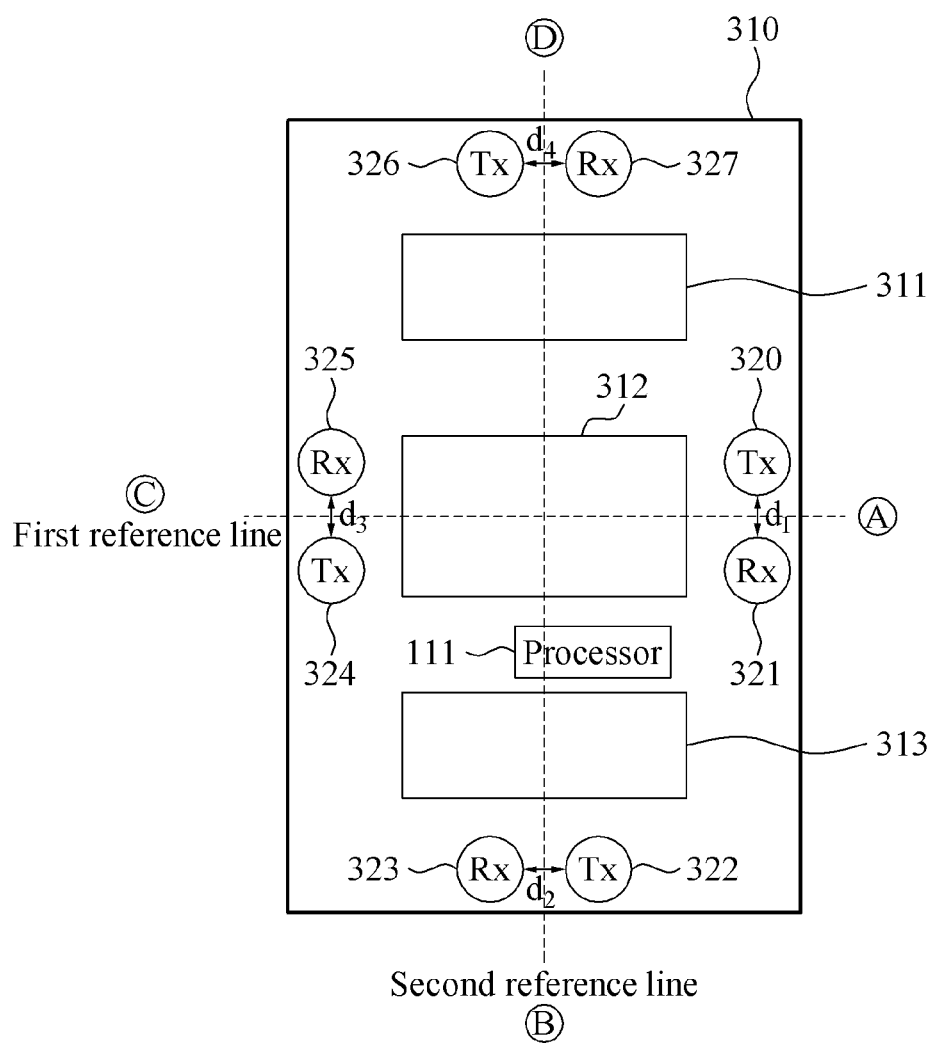
FIGS. 3A through 3D illustrate examples of a rear side of a battery management apparatus.

In an example of FIG. 3A, a processor 111 and IR communicators 320 through 327 are located on a board 310 of the battery management apparatus 110.

In an example, the board 310 corresponds to a printed circuit board (PCB).

The board 310 includes a plurality of holes, for example, holes 311, 312 and 313. In other words, the holes 311 through 313 are formed in the board 310. A battery cell 120 includes a cathode portion, a vent, and an anode portion, which will be described below. The holes 311, 312 and 313 respectively correspond to the cathode portion, the vent, and the anode portion of the battery cell 120.

In an example, the processor 111 is installed or located between the holes 312 and 313, as shown in FIG. 3A. However, examples are not limited thereto, and the processor 111 may be installed or located in any location of the board 310.

The IR communicators 320 through 327 perform IR communications in lateral directions of the battery management apparatus 110. For example, the IR communicators 320 and 321 included in a first IR communicator set perform an IR communication in a first lateral direction. In other words, the IR communicator 320 transmits data to a neighboring battery management apparatus at a location A via the IR communication, and the IR communicator 321 receives data from the neighboring battery management apparatus at the location A via the IR communication. Similarly, IR communicators 322 and 323 included in a second IR communicator set perform an IR communication in a second lateral direction, and IR communicators 324 and 325 included in a third IR communicator set perform an IR communication in a third lateral direction. Also, IR communicators 326 and 327 included in a fourth IR communicator set perform an IR communication in a fourth lateral direction.

Depending on examples, for IR communications in the lateral directions of the battery management apparatus 110, or various directions, the IR communicators shown above are arranged in various forms.

Referring to FIG. 3A, the IR communicators 320 and 321 are located to correspond to a first side (i.e., a right side as viewed from the rear side of FIG. 3A) of the battery management apparatus 100 (or the board 310), and the IR communicators 322 and 323 are located to correspond to a second side (i.e., a lower side as viewed from the rear side of FIG. 3A) of the battery management apparatus 110 (or the board 310). For example, the IR communicators 320 and 321 may be located near or along the first side of the board 310, and the IR communicators 322 and 323 may be located near or along the second side of the board 310. Also, the IR communicators 324 and 325 are located to correspond to a third side (i.e., a left side as viewed from the rear side of FIG. 3A) of the battery management apparatus 110 (or the board 310), and the IR communicators 326 and 327 are located to correspond to a fourth side (i.e., an upper side as viewed from the rear side of FIG. 3A) of the battery management apparatus 110 (or the board 310). For example, the IR communicators 324 and 325 may be located near or along the third side of the board 310, and the IR communicators 326 and 327 may be located near or along the fourth side of the board 310.

In the example of FIG. 3A, the IR communicators 320 and 321 are spaced apart from each other by a distance $d_1$, and the IR communicators 322 and 323 are spaced apart from each other by a distance $d_2$. Also, the IR communicators 324 and 325 are spaced apart from each other by a distance $d_3$, and the IR communicators 326 and 327 are spaced apart from each other by a distance $d_4$. For example, the IR communicators 320 and 321 are arranged near the first side, the IR communicator 320 is located at a distance of $d_1/2$ above a first reference line, and the IR communicator 321 is located at a distance of $d_1/2$ below the first reference line. The IR communicators 322 and 323 are arranged near the second side, the IR communicator 322 is located at a distance of $d_2/2$ to the right of a second reference line, and the IR communicator 323 is located at a distance of $d_2/2$ to the left of the second reference line. The IR communicators 324 and 325 are arranged near the third side, the IR communicator 324 is located at a distance of $d_3/2$ below the first reference line, and the IR communicator 325 is located at a distance of $d_3/2$ above the first reference line. Also, the IR communicators 326 and 327 are arranged near the fourth side, the IR communicator 326 is located at a distance of $d_4/2$ to the left of the second reference line, and the IR communicator 327 is located at a distance of $d_4/2$ to the right of the second reference line.

In an example, the first reference line is a horizontal line of the board 310 and corresponds to, for example, a line passing through a central portion of the first side and a central portion of the third side. The second reference line is a vertical line of the board 310, and corresponds to, for example, a line passing through a central portion of the second side and a central portion of the fourth side.

In the example of FIG. 3A, the distances $d_1$, $d_2$, $d_3$, and $d_4$ are equal to each other. Depending on examples, the distances $d_1$ and $d_3$ may be equal to each other, and the distances $d_2$ and $d_4$ may be equal to each other, however, the distances $d_1$ and $d_3$ may be different from the distances $d_2$ and $d_4$. For example, as shown in FIG. 3B, distances $d_1$ and $d_3$ are greater than distances $d_2$ and $d_4$.

Figure 3B:
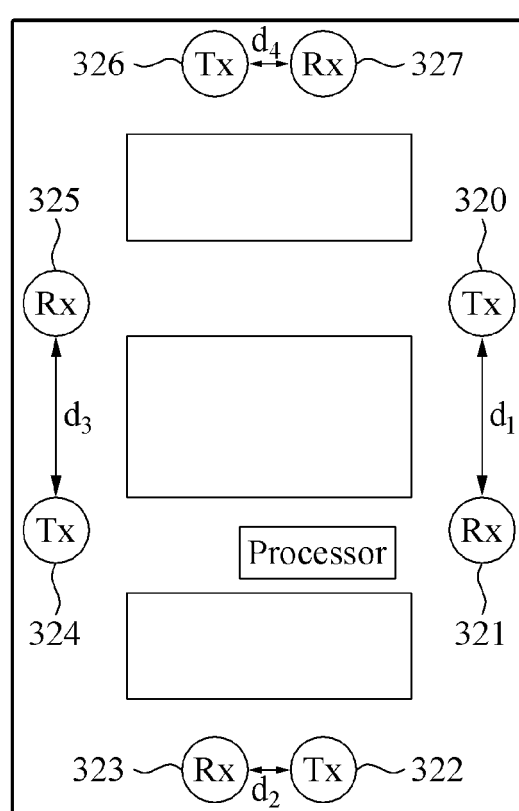
Figure 3C:
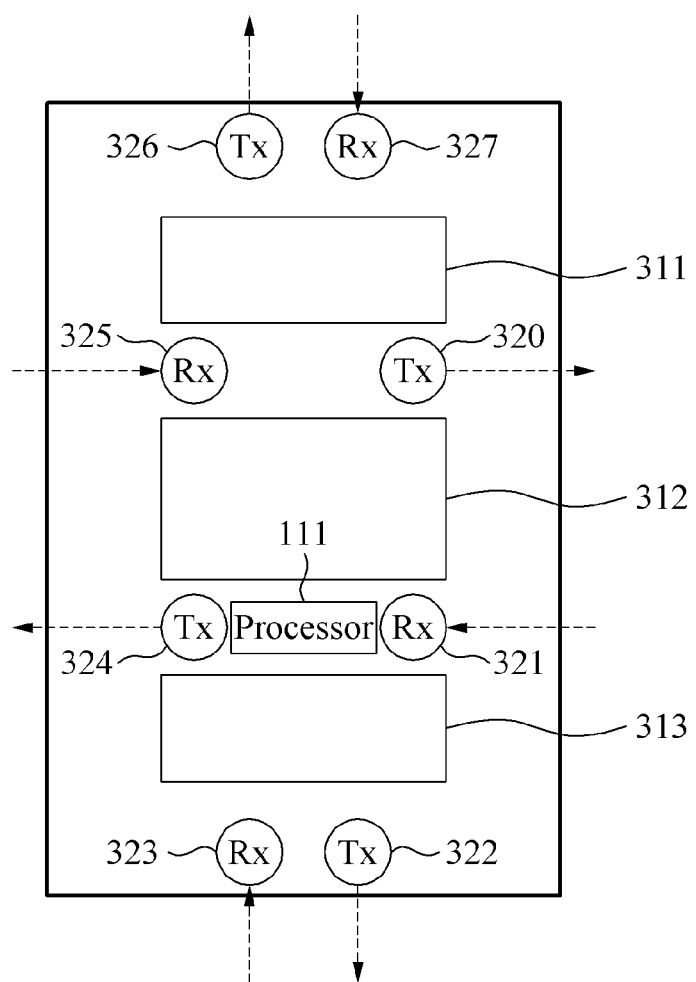
Figure 3D:
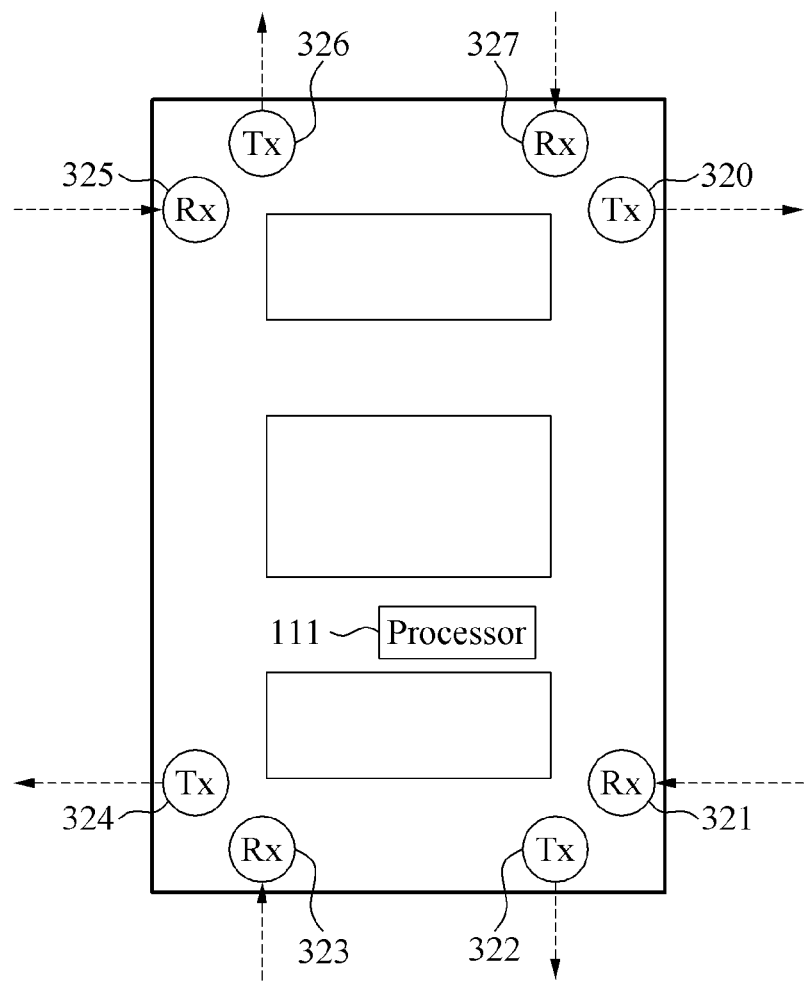

Locations or an arrangement of the IR communicators 320 through 327 are not limited to the examples of FIGS. 3A and 3B, and may vary. Referring to FIG. 3C, IR communicators 320 and 325 are located between holes 311 and 312, and IR communicators 321 and 324 are located between holes 312 and 313. Referring to FIG. 3D, IR communicators 320 and 327 are located at an upper right corner, and IR communicators 321 and 322 are located at a lower right corner. Also, IR communicators 323 and 324 are located at a lower left corner, and IR communicators 325 and 326 are located at an upper left corner.

The examples of the rear side of the battery management apparatus 110 described above with reference to FIGS. 3A through 3D are not limited to the description of FIGS. 3A through 3D. Other arrangements of locations or an arrangement of the IR communicators 320 through 327 may be used without departing from the spirit and scope of the illustrative examples described.

Figure 4:
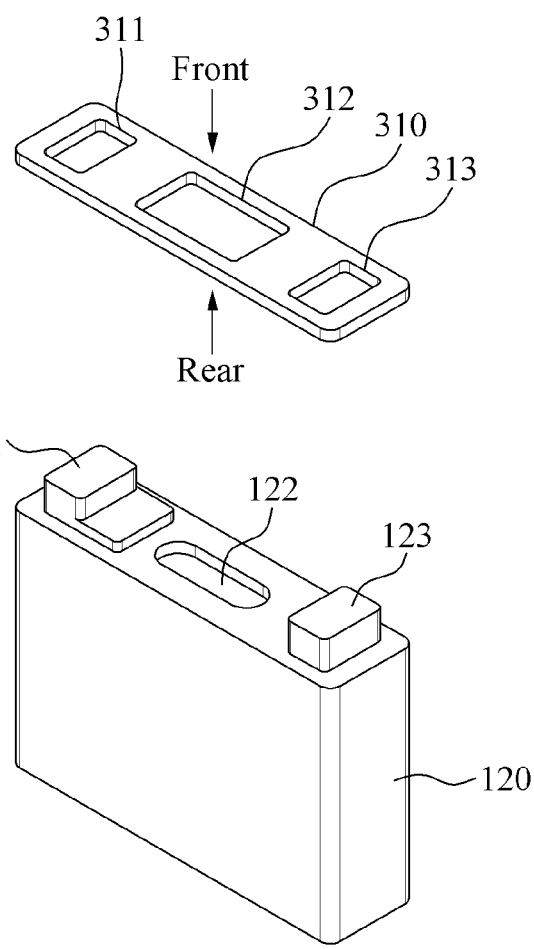
FIGS. 4 through 6 illustrate an example of a battery management apparatus installed in a battery cell.
Figure 5:
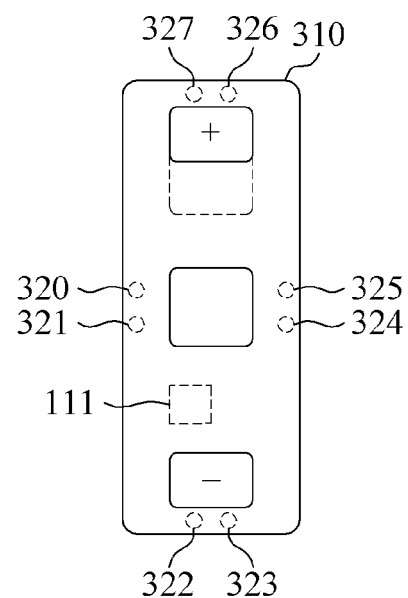
Figure 6:
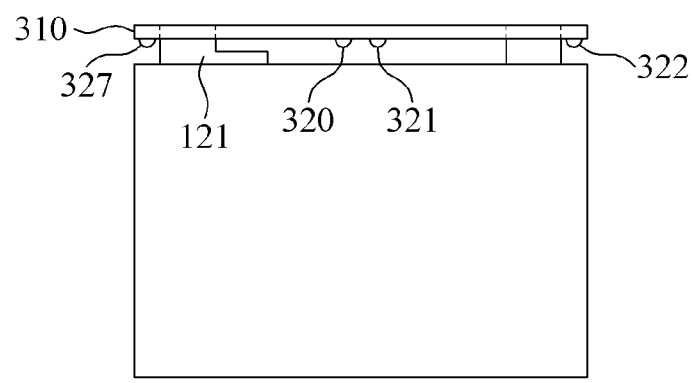

FIGS. 4 through 6 illustrate an example of a battery management apparatus installed in a battery cell.

Referring to FIG. 4, a battery management apparatus 110 is mounted on a top of a battery cell 120. A board 310 includes holes 311, 312 and 313 that respectively correspond to a cathode portion 121, a vent 122 and an anode portion 123 of the battery cell 120, as described above with reference to FIG. 3A. Accordingly, the battery management apparatus 110 is mounted on the top of the battery cell 120. A rear side of the battery management apparatus 110 faces the top of the battery cell 120. However, examples are not limited thereto, and the battery management apparatus 110 is installed on, for example, a side of the battery cell 120. For example, when the battery management apparatus 110 is designed to be installed on a side of the battery cell 120, at least one or all of the holes 311 through 313 may not be formed in the board 310.

FIG. 5 illustrates the top of the battery cell 120 on which the battery management apparatus 110 is mounted. A processor 111 and IR communicators 320 through 327 are represented by dashed lines, which indicate that the processor 111 and the IR communicators 320 through 327 are installed on a rear side of the board 310. Depending on examples, the processor 111 and the IR communicators 320 through 327 may be installed on a front side of the board 310.

FIG. 6 illustrates a left side of the battery cell 120 on which the battery management apparatus 110 is mounted. In FIG. 6, a cathode terminal and an anode terminal of the battery cell 120 do not protrude from the battery management apparatus 110. Depending on examples, the cathode terminal and the anode terminal of the battery cell 120 may protrude from the battery management apparatus 110.

Figure 7:
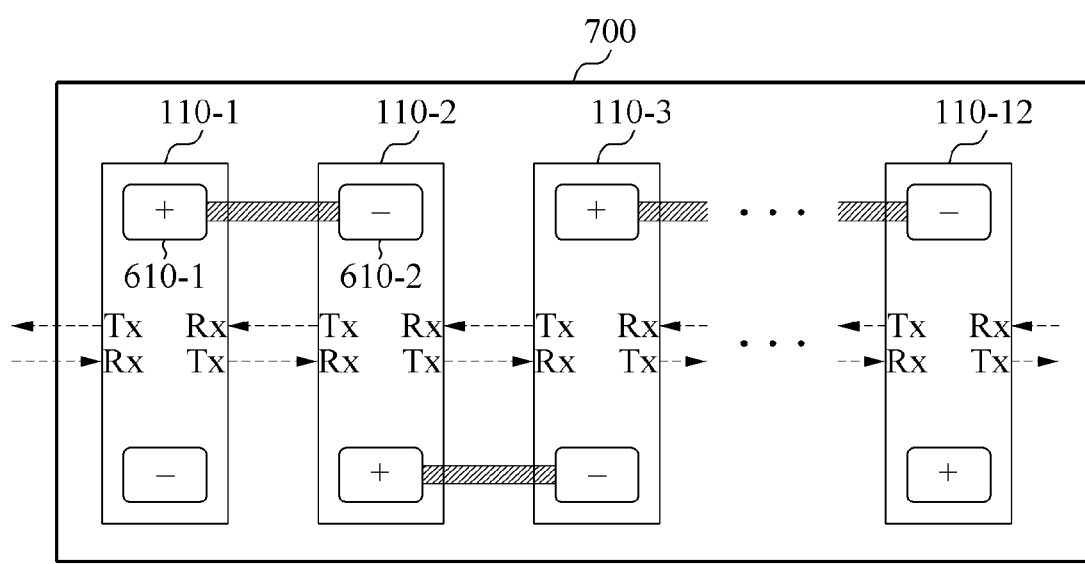
FIGS. 7 and 8 illustrate examples of a battery module.
Figure 8:
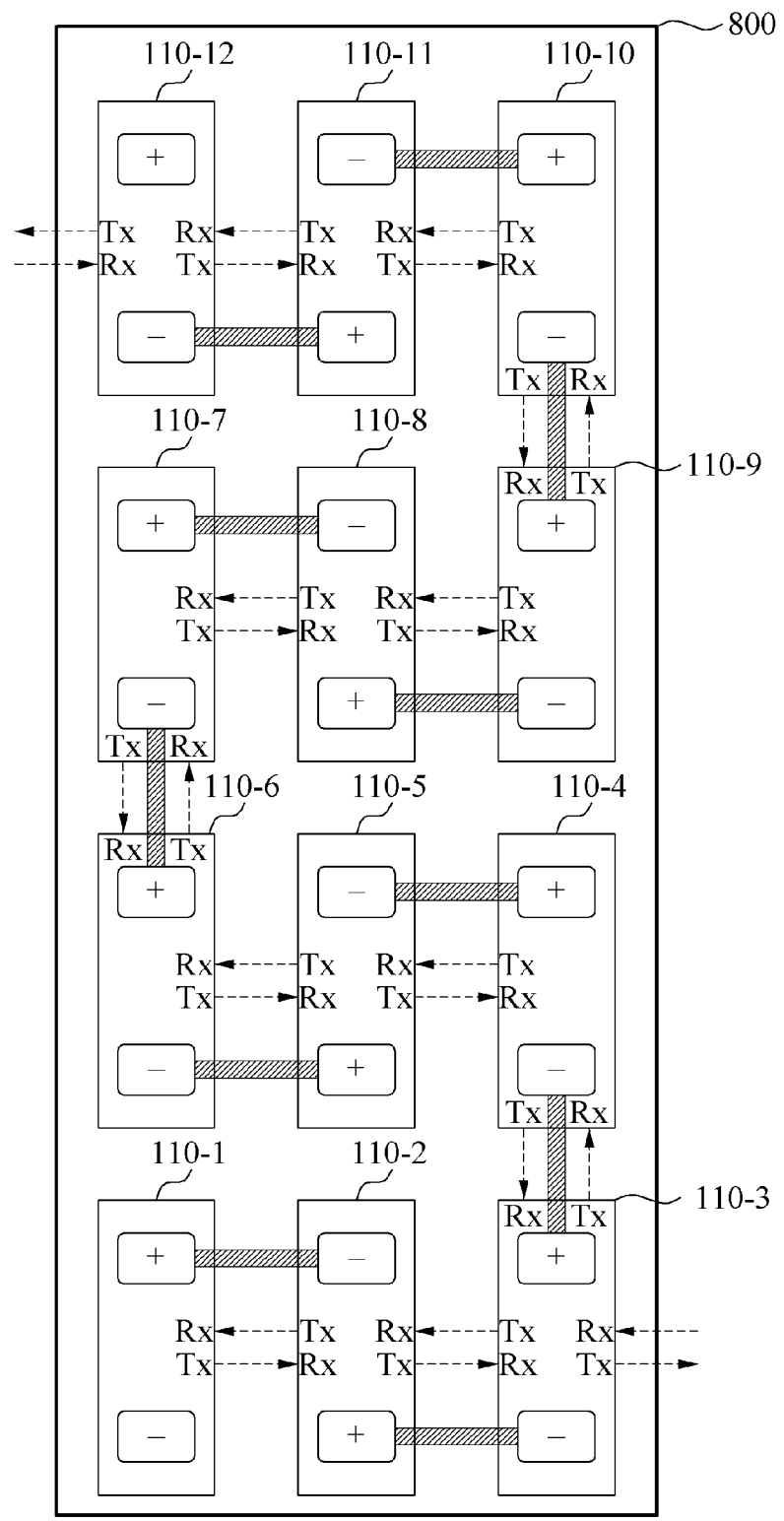

FIGS. 7 and 8 illustrate examples of a battery module.

Referring to FIG. 7, in a battery module 700, a plurality of battery cells, and battery management apparatuses 110-1 through 110-12 are arranged in parallel. The battery cells are electrically connected in series.

In FIG. 7, each of the battery management apparatuses 110-1 through 110-12 performs an IR communication with a neighboring battery management apparatus. For example, a battery management apparatus 110-1 transmits sensing data of the battery management apparatus 110-1 to a battery management apparatus 110-2 using an IR communicator for transmission located near a right side of the battery management apparatus 110-1. The battery management apparatus 110-2 receives the sensing data using an IR communicator for reception located near a left side of the battery management apparatus 110-2. Similarly, each of the battery management apparatuses 110-1 through 110-12 performs an IR communication with a neighboring battery management apparatus.

Referring to FIG. 8, in a battery module 800, battery cells and battery management apparatuses 110-1 through 110-12 are physically arranged in a form of a 4×3 matrix. The battery cells are electrically connected in series.

In FIG. 8, each of the battery management apparatuses 110-1 through 110-12 performs an IR communication with a neighboring battery management apparatus. For example, a battery management apparatus 110-10 receives sensing data from a battery management apparatus 110-11 using an IR communicator for reception located near a left side of the battery management apparatus 110-10, and transmits sensing data of the battery management apparatus 110-10 to a battery management apparatus 110-9 using an IR communicator for transmission located near a lower side of the battery management apparatus 110-10. Similarly, each of the battery management apparatuses 110-1 through 110-12 performs an IR communication with a neighboring battery management apparatus.

The above arrangements of the battery cells of FIGS. 7 and 8 are merely examples, and are not limited to the description of FIGS. 7 and 8.

As described above, each of the battery management apparatuses 110-1 through 110-12 performs an IR communication in various directions, instead of using an antenna. Thus, the battery management apparatuses 110-1 through 110-12 are applicable to various arrangements of the battery cells, instead of changing a structure of each of the battery management apparatuses 110-1 through 110-12. In other words, the battery management apparatuses 110-1 through 110-12 are applicable to various configurations of the battery cells, instead of changing a structure of each of the battery management apparatuses 110-1 through 110-12.

Figure 9:
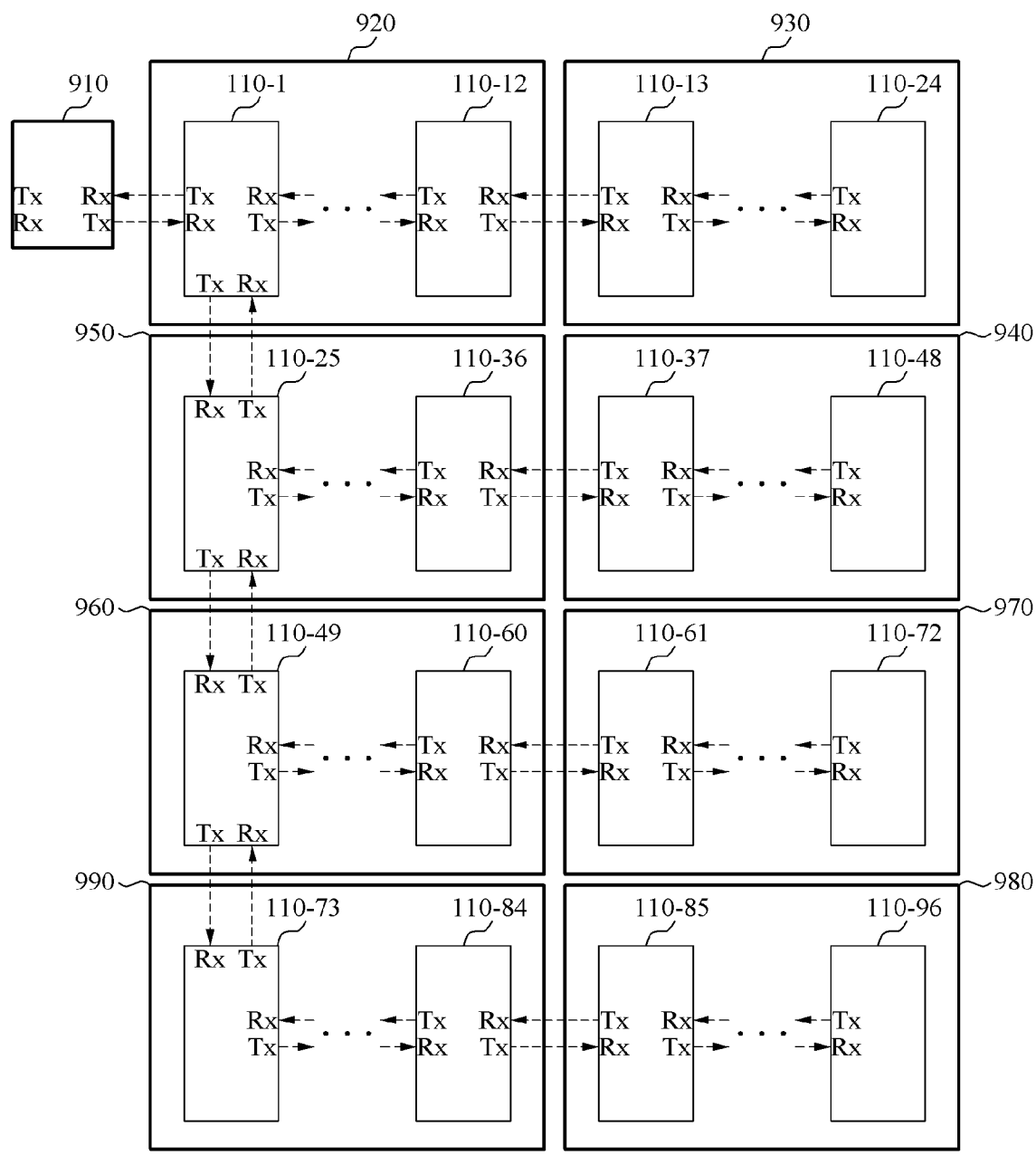
FIG. 9 illustrates an example of a battery pack.

FIG. 9 illustrates an example of a battery pack 900.

Referring to FIG. 9, the battery pack 900 includes a master battery management apparatus 910, and a plurality of battery modules, for example, battery modules 920 through 980. The battery modules 920 through 980 include battery cells and battery management apparatuses 110-1 through 110-96. Each of the battery modules 920 through 980 corresponds to, for example, the above-described battery module 700 or 800. Also, the battery modules 920 through 980 are electrically connected in series.

The battery management apparatuses 110-1 through 110-96 may be referred to as "slave battery management apparatuses."

The master battery management apparatus 910 controls the battery management apparatuses 110-1 through 110-96. For example, referring to FIG. 9, when the master battery management apparatus 910 sends a control command (for example, a sensing command) to a battery management apparatus 110-1, the battery management apparatus 110-1 transmits the control command via an IR communication to neighboring battery management apparatuses (for example, a battery management apparatus 110-25, and a battery management apparatus located on a right side of the battery management apparatus 110-1). In this example, each of battery management apparatuses that receive the control command from the battery management apparatus 110-1 sends the control command via an IR communication to a neighboring battery management apparatus of each of battery management apparatuses. Through the above IR communications between the battery management apparatuses 110-1 through 110-96, the control command is transmitted to all the battery management apparatuses 110-1 through 110-96. A communication between the master battery management apparatus 910 and each of the battery management apparatuses 110-1 through 110-96 is merely an example and is not limited to the above description.

The master battery management apparatus 910 receives data of each of the battery management apparatuses 110-1 through 110-96. For example, each of battery management apparatuses 110-2 through 110-96 transmits sensing data of each of the battery management apparatuses 110-2 through 110-96 via an IR communication to a neighboring battery management apparatus. Through IR communication, sensing data of each of the battery management apparatuses 110-2 through 110-96 is directed to the battery management apparatus 110-1. In other words, through IR communications between the battery management apparatuses 110-1 through 110-96, the battery management apparatus 110-1 acquires sensing data of each of the battery management apparatuses 110-2 through 110-96. The battery management apparatus 110-1 transmits sensing data of the battery management apparatus 110-1 and sensing data of each of the battery management apparatuses 110-2 through 110-96 to the master battery management apparatus 910. For example, the master battery management apparatus 910 determines state information (for example, an SOC, or an SOH) of each of the battery cells based on sensing data of each of the battery management apparatuses 110-1 through 110-96. Also, the master battery management apparatus 910 determines state information of each of the battery modules 920 through 990, and state information of the battery pack 900.

The battery pack 900 is applicable to various devices, such as, for example, a vehicle, a walking assistance device, a wearable device, a security device, a robot, a mobile terminal, an energy storage system (ESS), and various Internet of Things (IoT) devices that use the batteries as a power source. The vehicle described herein refers to any mode of transportation, delivery, or communication such as, for example, an automobile, a truck, a tractor, a scooter, a motorcycle, a cycle, an amphibious vehicle, a snowmobile, a boat, a public transit vehicle, a bus, a monorail, a train, a tram, an autonomous or automated driving vehicle, an intelligent vehicle, a self-driving vehicle, an unmanned aerial vehicle, an electric vehicle (EV), a hybrid vehicle, or a drone.

Figure 10:
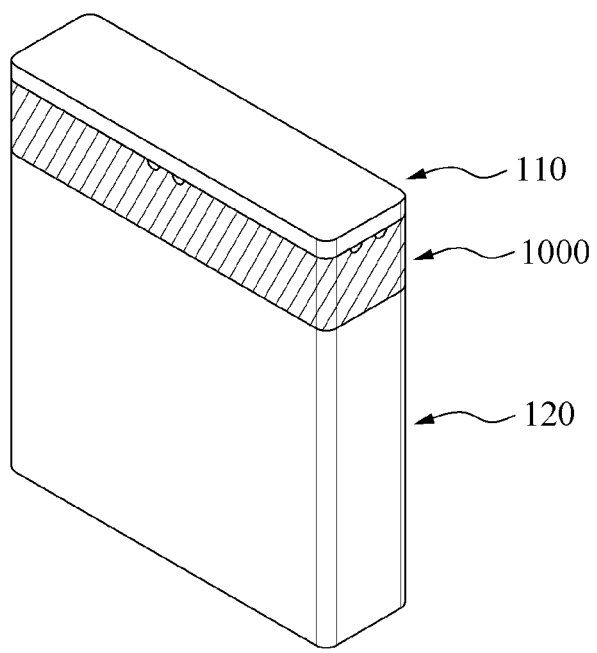
FIGS. 10 and 11 illustrate an example of a fixer.
Figure 11:
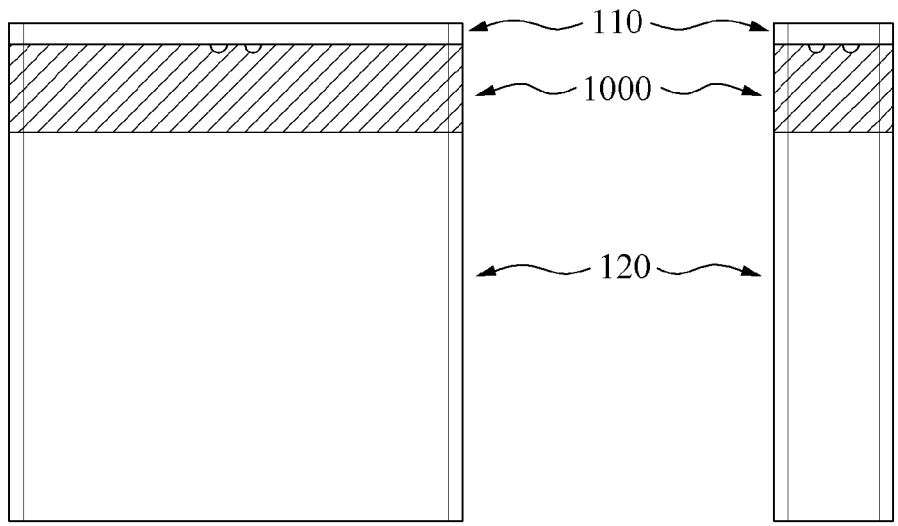

FIGS. 10 and 11 illustrate an example of a fixer 1000.

Referring to FIGS. 10 and 11, the fixer 1000 (for example, a fixing fence) is located between a battery management apparatus 110 and a battery cell 120. For example, the fixer 1000 is located between each battery cell and each of the battery management apparatuses 110-1 through 110-12 of FIGS. 7 and 8, or located between each battery cell and each of the battery management apparatuses 110-1 through 110-96 of FIG. 9.

The fixer 1000 more firmly fixes the battery management apparatus 110 to the battery cell 120. Also, the fixer 1000 does not cover IR communicators, for example, the IR communicators 112-1 through 112-4 of FIG. 2, or the IR communicators 320 through 327 of FIGS. 3A through 3D.

The fixer 1000 blocks IR light output from a battery management apparatus that does not face the battery management apparatus 110. In an example, referring to FIG. 8, the battery management apparatus 110-10 outputs IR light using an IR communicator located near a lower side of the battery management apparatus 110-10 to transmit data to the battery management apparatus 110-9 that faces the battery management apparatus 110-10. In this example, the IR light is also directed to the battery management apparatus 110-8 that does not face the battery management apparatus 110-10. A blocker of the battery management apparatus 110-8 blocks the IR light from battery management apparatus 110-10 to prevent an IR communicator of the battery management apparatus 110-8 from receiving the IR light from battery management apparatus 110-10. Thus, it is possible to prevent the data of the battery management apparatus 110-10 from being transmitted to the battery management apparatus 110-8. In another example, referring to FIG. 9, a battery management apparatus 110-13 in a battery module 930 outputs IR light using an IR communicator located near a left side of the battery management apparatus 110-13 to transmit data to a battery management apparatus 110-12 that faces the battery management apparatus 110-13. In this example, the IR light is also directed to a battery management apparatus 110-36 that does not face the battery management apparatus 110-13, and a blocker of the battery management apparatus 110-36 blocks IR light from battery management apparatus 110-13. Thus, it is possible to prevent the data of the battery management apparatus 110-13 from being transmitted to the battery management apparatus 110-36. Depending on examples, the fixer 1000 may be black in color. However, black is merely an example, and a color of the fixer 1000 is not limited to being black.

FIGS. 12A through 15 illustrate examples of a communication performed in response to battery management apparatuses being misaligned.

Figure 12A:
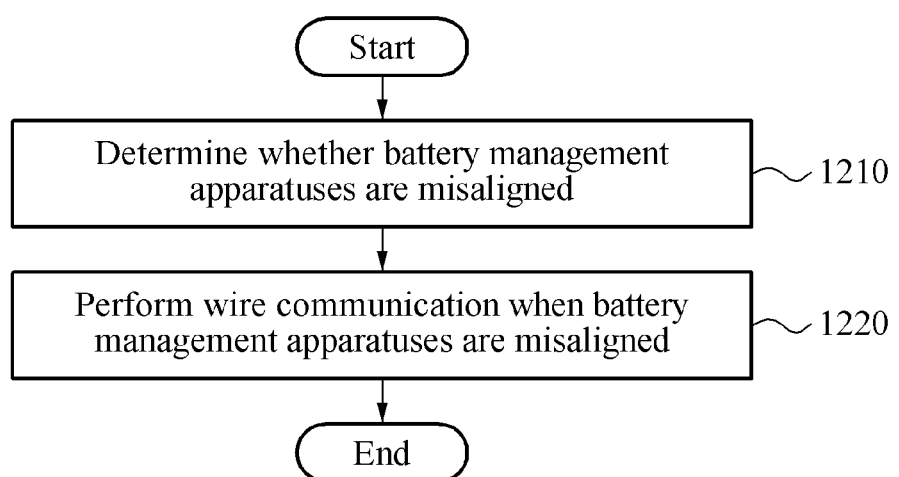
FIGS. 12A through 15 illustrate examples of a communication performed in response to battery management apparatuses being misaligned in a battery pack.
Figure 12B:
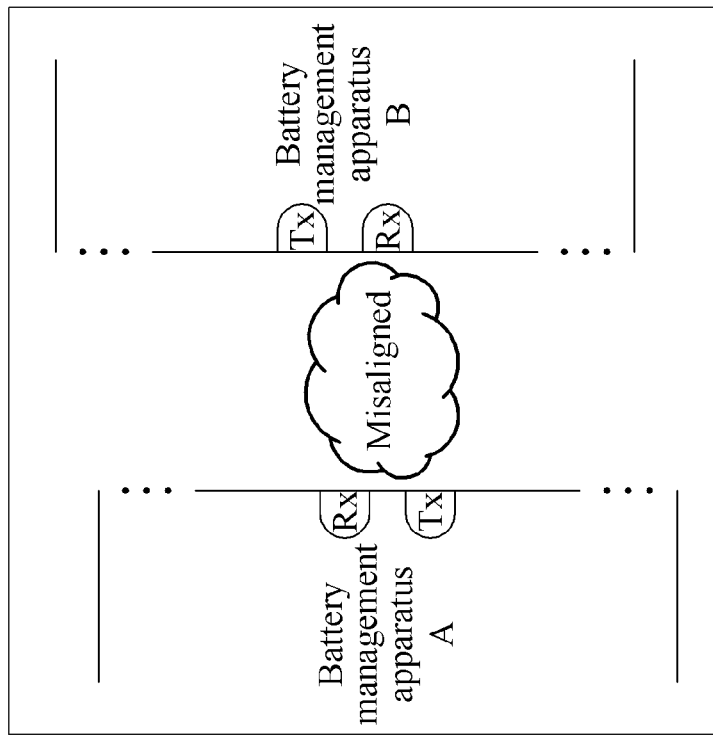
Figure 12C:
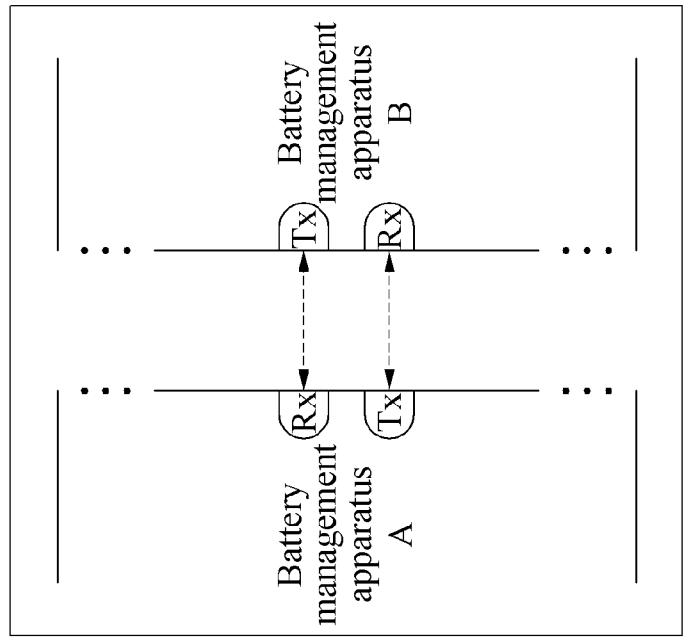

Referring to FIG. 12A, in operation 1210, a battery management apparatus 110 determines whether the battery management apparatus 110 is misaligned with another battery management apparatus. A misalignment indicates that IR communicators at each of edges that face in battery management apparatuses adjacent to each other do not properly face each other. Referring to FIG. 12B, IR communicators located near a right side of a battery management apparatus A face IR communicators located near a left side of a battery management apparatus, which indicates that the battery management apparatuses A and B are aligned. In other words, an example, in which an IR communicator for reception located near the right side of the battery management apparatus A faces an IR communicator for transmission located near the left side of the battery management apparatus B and in which an IR communicator for transmission located near the right side of the battery management apparatus A faces an IR communicator for reception located near the left side of the battery management apparatus B, indicates that the battery management apparatuses A and B are aligned. Referring to FIG. 12C, IR communicators located near a right side of a battery management apparatus A do not face IR communicators located near a left side of a battery management apparatus B, which indicates that the battery management apparatuses A and B are misaligned. In an example, battery management apparatuses may be misaligned due to an impact on the battery pack 900. Referring back to FIG. 12A, when the battery management apparatus 110 is misaligned with a neighboring battery management apparatus, a wire communication is performed in operation 1220. In FIG. 12C, since an IR communicator for reception located near the right side of the battery management apparatus A does not face an IR communicator for transmission located near the left side of the battery management apparatus B, it is difficult to accurately receive IR light output from the IR communicator for transmission. Similarly, since an IR communicator for reception located near the left side of the battery management apparatus B does not face an IR communicator for transmission located near the right side of the battery management apparatus A, it is difficult to accurately receive IR light output from the IR communicator for transmission. When the battery management apparatus 110 is misaligned with a neighboring battery management apparatus, a wire communication, instead of an IR communication, is performed. Hereinafter, further examples of performing a communication when a misalignment occurs in a battery pack 900 will be described with reference to FIGS. 13 through 15.

Figure 13:
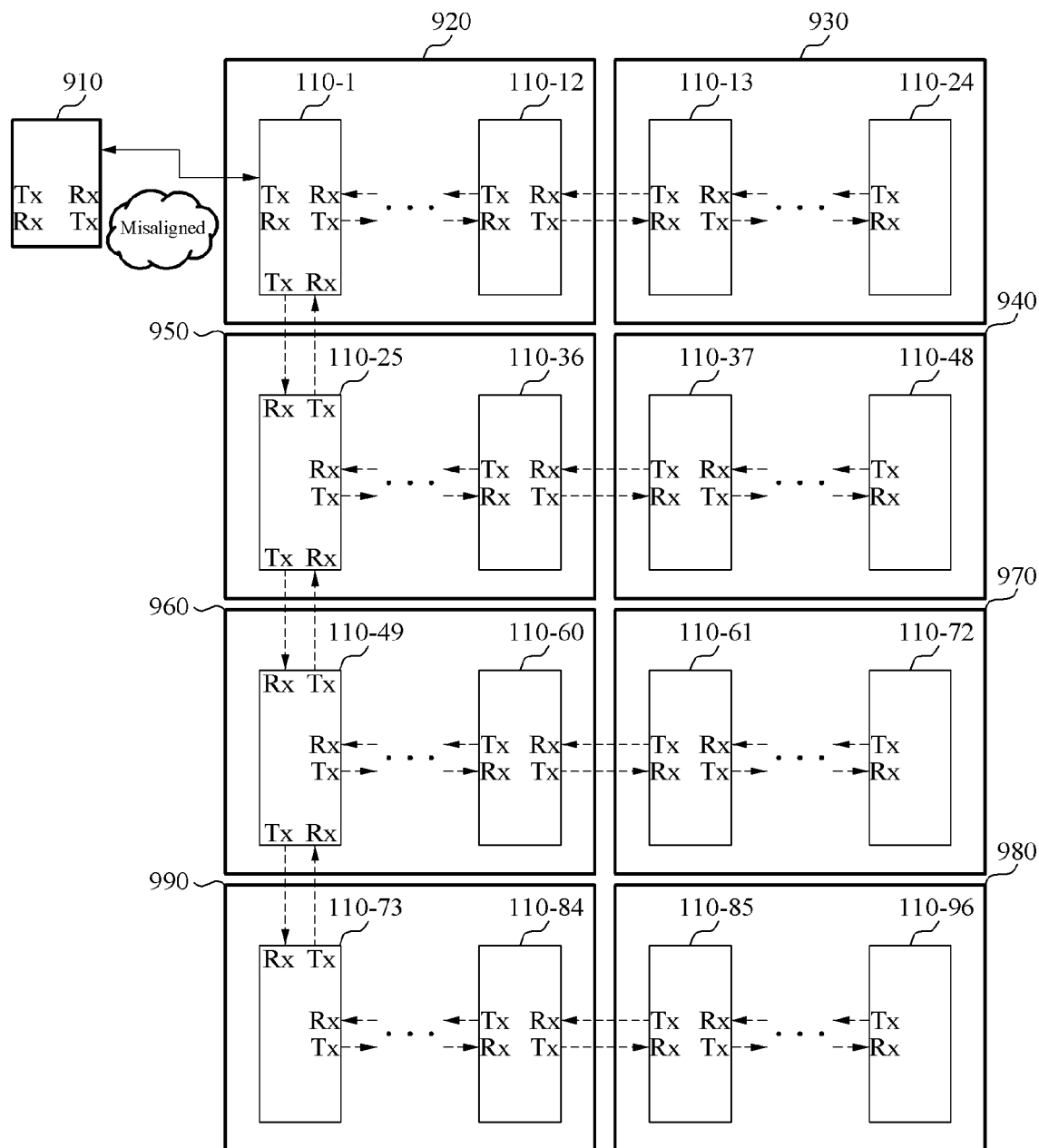

In an example of FIG. 13, a master battery management apparatus 910 and a battery management apparatus 110-1 are misaligned. IR communicators located near a right side of the master battery management apparatus 910 do not face IR communicators located near a left side of the battery management apparatus 110-1. In this example, because it is difficult for the battery management apparatus 110-1 to perform an IR communication with the master battery management apparatus 910, the battery management apparatus 110-1 performs a wire communication. The wire communication includes, for example, a controller area network (CAN) communication.

Figure 14:
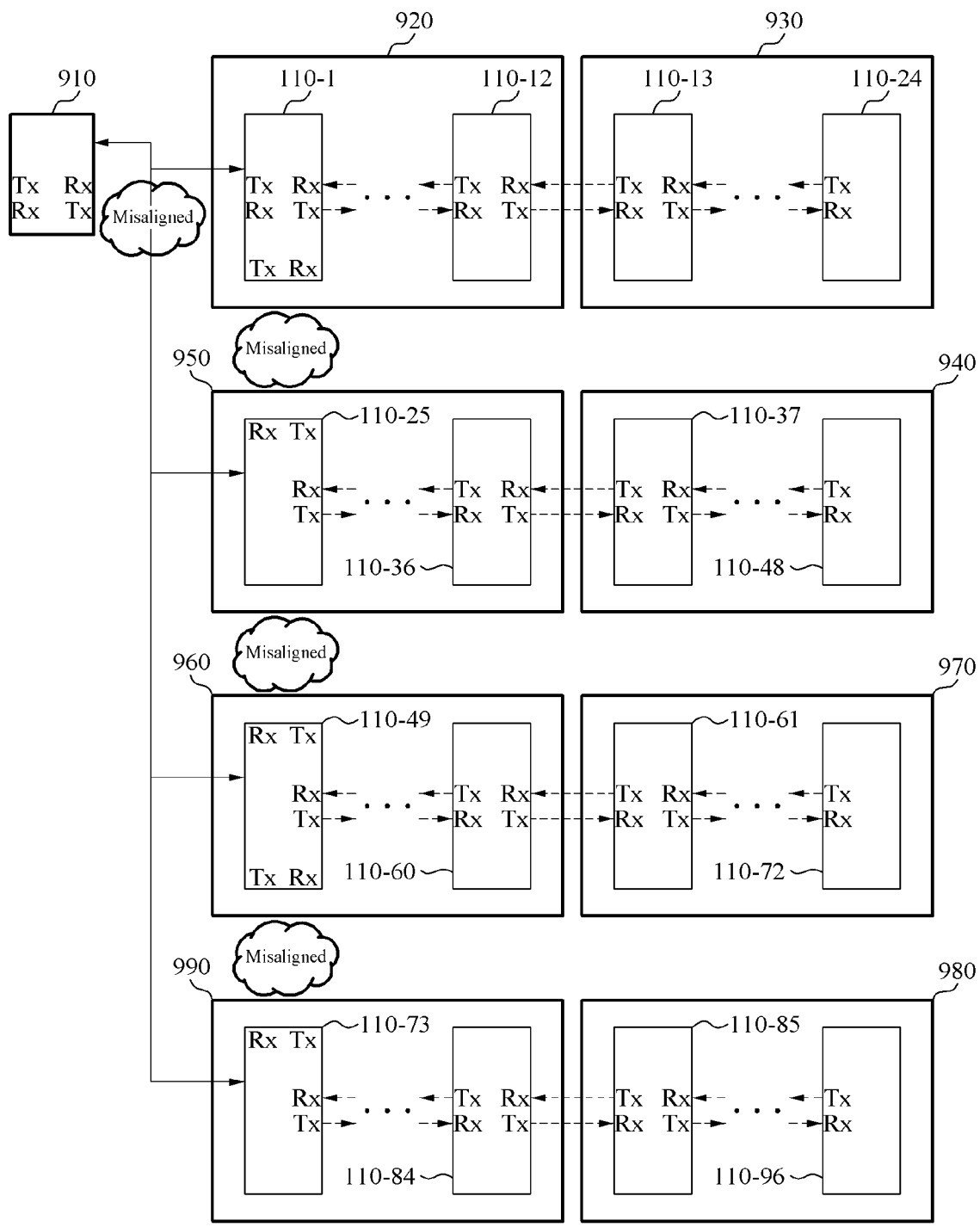

In an example of FIG. 14, a master battery management apparatus 910 and a battery management apparatus 110-1 are misaligned, and battery management apparatuses 110-1 and 110-25 are misaligned. Also, battery management apparatuses 110-25 and 110-49 are misaligned, and battery management apparatuses 110-49 and 110-73 are misaligned. In this example, it is difficult to perform IR communications among the battery management apparatuses 110-1, 110-25, 110-49, and 110-73, and also difficult to perform an IR communication between the battery management apparatus 110-1 and the master battery management apparatus 910. Thus, each of the battery management apparatuses 110-1, 110-25, 110-49, and 110-73 performs a wire communication with the master battery management apparatus 910.

Figure 15:
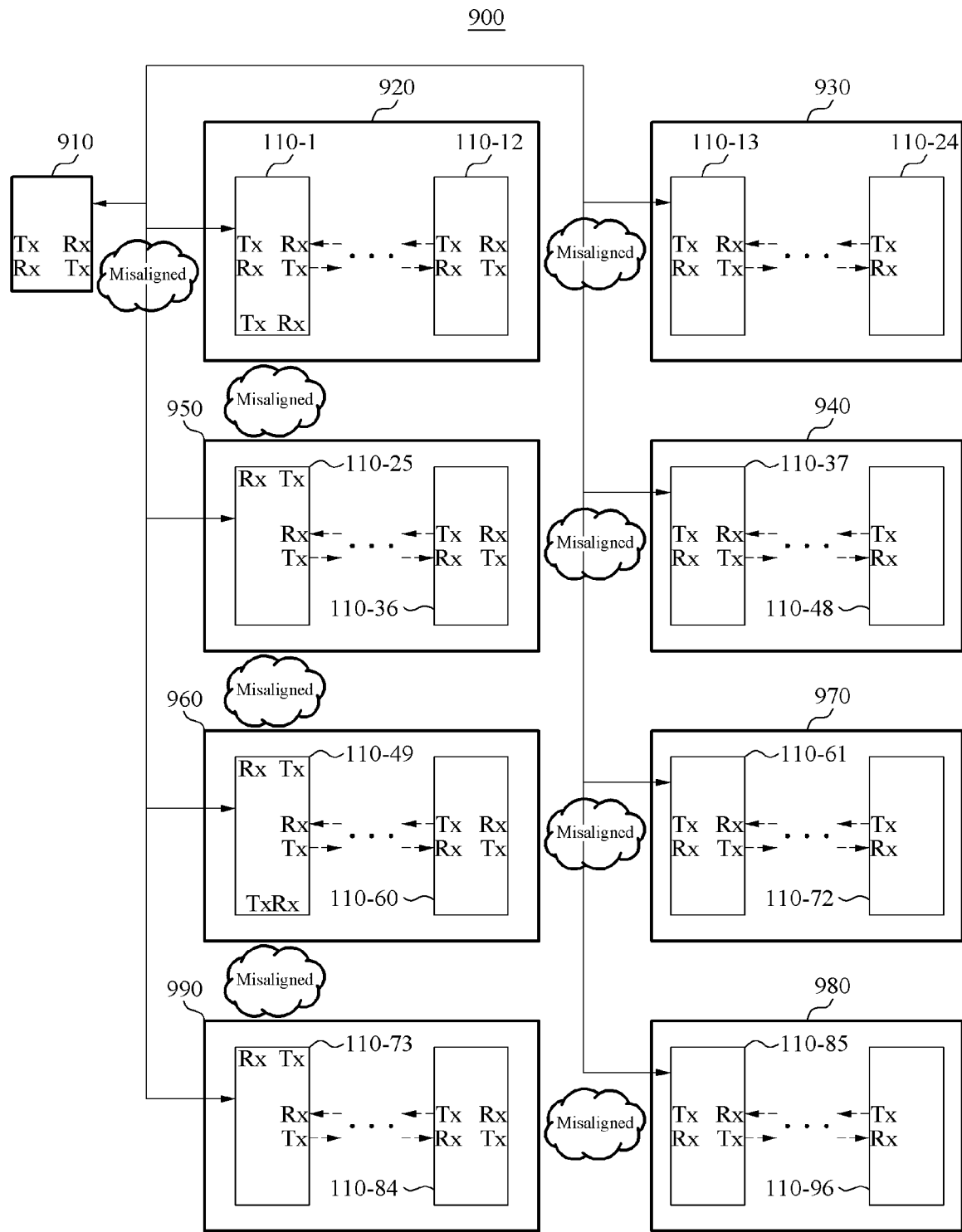

In an example of FIG. 15, a master battery management apparatus 910 and a battery management apparatus 110-1 are misaligned, and battery management apparatuses 110-1 and 110-25 are misaligned. Also, battery management apparatuses 110-25 and 110-49 are misaligned, and battery management apparatuses 110-49 and 110-73 are misaligned. In addition, battery management apparatuses 110-12 and 110-13 are misaligned, and battery management apparatuses 110-36 and 110-37 are misaligned. Battery management apparatuses 110-60 and 110-61 are misaligned, and battery management apparatuses 110-84 and 110-85 are misaligned. In this example, each of the battery management apparatuses 110-1, 110-12, 110-13, 110-25, 110-36, 110-37, 110-49, 110-60, 110-61, 110-73, 110-84, and 110-85 performs a wire communication with the master battery management apparatus 910.

A wire communication is performed despite a misalignment occurring in the battery pack 900 as described above with reference to FIGS. 12A through 15, and thus a control command of the master battery management apparatus 910 is transferred to the battery management apparatuses 110-1 through 110-96, and data of each of the battery management apparatuses 110-1 through 110-96 is transmitted to the master battery management apparatus 910.

The above description of FIGS. 1 through 11 is also applicable to the examples of FIGS. 12A through 15, and thus is not repeated herein.

Because a battery module-based battery management system (BMS) and a battery cell-based BMS according to a related art each have a single structure, it is difficult to apply the existing battery module-based BMS and the existing battery cell-based BMS to various arrangements of battery cells. For example, when an arrangement and/or a number of battery cells included in a battery module with a BMS according to a related art is changed, the BMS needs to be redesigned. Also, because a battery cell with a BMS according to a related art performs a wireless communication requiring an antenna, an antenna layout needs to be changed when an arrangement of battery cells is changed. According to examples, a battery management apparatus includes IR communicators that face at least one neighboring battery management apparatus, and thus it is possible to apply the battery management apparatus to a battery module, instead of changing a structure of the battery management apparatus, despite a change in an arrangement and/or a number of battery cells included in the battery module.

The battery management apparatus 110, the processor 111, and other apparatuses, units, modules, devices, and other components described herein are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The method illustrated in FIG. 12A that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In an example, the instructions or software includes at least one of an applet, a dynamic link library (DLL), middleware, firmware, a device driver, an application program storing the method of preventing the collision. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as, a multimedia card micro or a secure digital (SD) card or extreme digital (XD) card, magnetic tapes, floppy disks, magneto-optical data storage devices, optical data storage devices, hard disks, solid-state disks, and any other device that is configured to store the instructions or software and any associated data, data files, and data structures in a non-transitory manner and providing the instructions or software and any associated data, data files, and data structures to a processor or computer so that the processor or computer can execute the instructions. Examples of a non-transitory computer-readable storage medium include read-only memory (ROM), random-access memory (RAM), CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A battery management apparatus comprising:
   a processor configured to collect sensing data of a battery using a sensor; and
   infrared (IR) communicators located to face a neighboring battery management apparatus of the battery management apparatus,
   wherein the processor is configured to transmit the collected sensing data to the neighboring battery management apparatus using one of the IR communicators,
   wherein the IR communicators comprise:
      a first IR communicator set configured to perform an IR communication in a first lateral direction of the battery management apparatus;
      a second IR communicator set configured to perform an IR communication in a second lateral direction of the battery management apparatus;
      a third IR communicator set configured to perform an IR communications in a third lateral direction of the battery management apparatus; and
      a fourth IR communicator set configured to perform an IR communication in a fourth lateral direction of the battery management apparatus.

2. The battery management apparatus of claim 1, wherein a board of the battery management apparatus comprises a hole corresponding to each of electrodes of the battery and a hole corresponding to a vent of the battery.

3. The battery management apparatus of claim 2, wherein the processor is located between the hole corresponding to the vent and a hole corresponding to one of the electrodes.

4. The battery management apparatus of claim 1, wherein the IR communicators are located adjacent to sides of a board of the battery management apparatus.

5. The battery management apparatus of claim 1, wherein each of the first IR communicator set through the fourth IR communicator set comprises an IR communicator for transmission and an IR communicator for reception.

6. The battery management apparatus of claim 1, wherein an IR communicator for transmission of each of the first IR communicator set through the fourth IR communicator set is spaced apart from an IR communicator for reception of each of the first IR communicator set through the fourth IR communicator set.

7. A battery module comprising:
batteries; and
battery management apparatuses corresponding to the batteries,
wherein each of the battery management apparatuses comprises a processor configured to collect sensing data of a corresponding battery of the batteries, and infrared ray (IR) communicators located to face a neighboring battery management apparatus of the each of the battery management apparatuses,
wherein the IR communicators comprise:
a first IR communicator set configured to perform an IR communication in a first lateral direction of each of the battery management apparatuses;
a second IR communicator set configured to perform an IR communication in a second lateral direction of each of the battery management apparatuses;
a third IR communicator set configured to perform an IR communication in a third lateral direction of each of the battery management apparatuses; and
a fourth IR communicator set configured to perform an IR communication in a fourth lateral direction of each of the battery management apparatuses.

8. The battery module of claim 7, wherein a board of the each of the battery management apparatus comprises a hole corresponding to each of electrodes of the corresponding battery and a hole corresponding to a vent of the corresponding battery.

9. The battery module of claim 8, wherein the processor is located between the hole corresponding to the vent and a hole corresponding to one of the electrodes.

10. The battery module of claim 7, wherein the IR communicators are located adjacent to sides of a board of each of the battery management apparatuses.

11. The battery module of claim 7, wherein each of the first IR communicator set through the fourth IR communicator set comprises an IR communicator for transmission and an IR communicator for reception.

12. The battery module of claim 7, wherein an IR communicator for transmission of each of the first IR communicator set through the fourth IR communicator set is spaced apart from an IR communicator for reception of each of the first IR communicator set through the fourth IR communicator set.

13. The battery module of claim 7, further comprising:
fixers that are configured to fix each of the battery management apparatuses to the corresponding battery.

14. The battery module of claim 13, wherein each of the fixers selectively blocks IR light output from the battery management apparatuses that are not adjacent to the corresponding battery management apparatus.

15. A battery pack comprising:
batteries;
slave battery management apparatuses corresponding to the batteries, each of the slave battery management apparatuses comprising a processor configured to collect sensing data of a corresponding battery of the batteries, and infrared ray (IR) communicators located to face a neighboring slave battery management apparatus of the each of the slave battery management apparatuses; and
a master battery management apparatus configured to control the slave battery management apparatuses,
wherein the IR communicators comprise:
a first IR communicator set configured to perform an IR communication in a first lateral direction of each of the battery management apparatuses;
a second IR communicator set configured to perform an IR communication in a second lateral direction of each of the battery management apparatuses;
a third IR communicator set configured to perform an IR communication in a third lateral direction of each of the battery management apparatuses; and
a fourth IR communicator set configured to perform an IR communication in a fourth lateral direction of each of the battery management apparatuses.

16. The battery pack of claim 15, wherein a board of the each of the slave battery management apparatuses comprises a hole corresponding to each of electrodes of the corresponding battery and a hole corresponding to a vent of the corresponding battery.

17. The battery pack of claim 16, wherein the processor is located between the hole corresponding to the vent and a hole corresponding to one of the electrodes.

18. The battery pack of claim 15, wherein the IR communicators are located adjacent to sides of a board of each of the slave battery management apparatuses.

19. The battery pack of claim 15, wherein each of the first IR communicator set through the fourth IR communicator set comprises an IR communicator for transmission and an IR communicator for reception.

20. The battery pack of claim 15, wherein the master battery management apparatus is configured to perform a wire communication with a slave battery management apparatus configured to perform an IR communication with the master battery management apparatus, in response to the master battery management apparatus being misaligned with the slave battery management apparatus.

21. The battery pack of claim 15, wherein a slave battery management apparatus of the slave battery management apparatuses is configured to perform a wire communication with a neighboring slave battery management apparatus, in response to the slave battery management apparatuses being misaligned with the neighboring slave battery management apparatus.

22. A battery management apparatus comprising:
a processor configured to collect sensing data of a battery using a sensor; and
infrared (IR) communicators located to face a neighboring battery management apparatus, wherein the processor is configured to
transmit the collected sensing data to the neighboring battery management apparatus using one of the IR communicators, in response to the battery management apparatuses being aligned with the neighboring battery management apparatus, and transmit the collected sensing data to the neighboring battery management apparatus using wire communication, in response to the battery management apparatuses being misaligned with the neighboring battery management apparatus.

23. The battery management apparatus of claim 22, wherein each of the IR communicators comprise an IR communicator for transmission and an IR communicator for reception, and the IR communicator for transmission and the IR communicator for reception are located:
 adjacent to sides of a board of the battery management apparatus,
 spaced apart from each other, and
 substantially equidistant from a center of the board.

* * * * *